(12) United States Patent  
Choi et al.

(10) Patent No.: US 12,457,804 B2  
(45) Date of Patent: Oct. 28, 2025

(54) DISPLAY DEVICE

(71) Applicant: LG DISPLAY CO., LTD., Seoul (KR)

(72) Inventors: HongRak Choi, Seoul (KR); Dohyung Lee, Gyeonggi-do (KR); ChanYong Jeong, Gyeonggi-do (KR); KyungChul Ok, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 538 days.

(21) Appl. No.: 17/876,101

(22) Filed: Jul. 28, 2022

(65) Prior Publication Data

US 2023/0145843 A1  May 11, 2023

(30) Foreign Application Priority Data

Nov. 8, 2021 (KR) .......................... 10-2021-0152621

(51) Int. Cl.  
*H10D 86/60* (2025.01)  
*H10D 86/40* (2025.01)

(52) U.S. Cl.  
CPC ........... *H10D 86/60* (2025.01); *H10D 86/423* (2025.01); *H10D 86/481* (2025.01)

(58) Field of Classification Search  
CPC .... H10D 86/60; H10D 86/423; H10D 86/481; H10D 30/6755; H10D 30/6734; H10D 30/6757; H10D 30/6723; H10D 64/62; H10D 86/421; H10D 30/67; H10D 62/124;

(Continued)

(56) References Cited

U.S. PATENT DOCUMENTS 8,653,558 B2 * 2/2014 Green ................. H10D 64/685  
                                                                   257/E21.403  
9,136,107 B2 * 9/2015 Katani .............. H01L 21/02112  
2019/0280021 A1 9/2019 Lee et al.

(Continued)

FOREIGN PATENT DOCUMENTS

KR 10-2019-0107247 A 9/2019  
KR 10-2020-0050266 A 5/2020

(Continued)

OTHER PUBLICATIONS

Office Action issued on Dec. 19, 2024 for Korean Patent Application No. 10-2021-0152621.

(Continued)

*Primary Examiner* — Tan N Tran  
(74) *Attorney, Agent, or Firm* — Morgan, Lewis & Bockius LLP

(57) ABSTRACT

A display device includes a main active layer positioned on a substrate includes a channel area, a first conductorized area positioned on a first side of the channel area, and a second conductorized area positioned on a second side of the channel area, a sacrificial active layer is positioned on the main active layer, a gate insulating film is positioned on the sacrificial active layer, a first electrode is positioned on the sacrificial active layer, a portion of the first electrode overlaps the first conductorized area of the main active layer, a second electrode is positioned on the sacrificial active layer, a portion of the second electrode overlaps the second conductorized area of the main active layer, and a third electrode positioned on the gate insulating film overlaps the channel area of the main active layer.

16 Claims, 15 Drawing Sheets

(58) Field of Classification Search
CPC .... H10D 64/20; H10D 86/40; H10K 59/1213; H10K 59/1216; H10K 59/126
See application file for complete search history.

(56) References Cited

U.S. PATENT DOCUMENTS

2020/0212221 A1    7/2020   Baeck et al.
2022/0173130 A1    6/2022   Ji et al.

FOREIGN PATENT DOCUMENTS

KR    10-2020-0082310 A    7/2020
KR    10-2021-0001739 A    1/2021
KR    10-2021-0035694 A    4/2021

OTHER PUBLICATIONS

Notice of Allowance issued on Aug. 27, 2025 for Korean Patent Application No. 10-2021-0152621 with English translation.

\* cited by examiner

X1 area

Y1 area

DISPLAY DEVICE

CROSS REFERENCE TO RELATED APPLICATION

This application claims priority from Korean Patent Application No. 10-2021-0152621, filed on Nov. 8, 2021, which is hereby incorporated by reference for all purposes as if fully set forth herein.

BACKGROUND

Technical Field

Embodiments relate to a display device.

Description of Related Art

Transistors are widely used as switching devices or driving devices in the field of electronic devices. In particular, thin-film transistors that may be fabricated on a glass substrate or on a plastic substrate are widely used as switching devices of display devices such as liquid crystal display (LCD) devices or organic light-emitting display devices.

On the basis of the material of an active layer thereof, thin-film transistors may be categorized as amorphous silicon (a-Si) thin-film transistors in which amorphous silicon is used for an active layer, polysilicon (poly-Si) thin-film transistors in which polysilicon is used for an active layer, and oxide semiconductor thin-film transistors in which oxide semiconductor is used for an active layer.

Since the amorphous silicon may be deposited to form an active layer in a short period of time, a-Si thin-film transistors are advantageous in terms of a short fabrication process time and low fabrication costs. In contrast, since a-Si thin-film transistors have low current driving ability and variations in the threshold voltage due to low mobility, the use of a-Si thin-film transistors to organic light-emitting display devices is disadvantageously restricted.

Poly-Si thin-film transistors are formed by depositing amorphous silicon and then crystallizing the deposited amorphous silicon. Since the fabrication process of poly-Si thin-film transistors requires an a-Si crystallization process, the number of process steps is increased, thereby increasing fabrication cost. In addition, since the crystallization process is performed at a high processing temperature, it is difficult to use poly-Si thin-film transistors in a large-area device. Furthermore, due to poly-Si characteristics, it is difficult to obtain uniformity in poly-Si thin-film transistors.

In the case of oxide semiconductor thin-film transistors, an oxide semiconductor film of an active layer may be formed at a relatively low temperature. In addition, oxide semiconductor thin-film transistors have high mobility and have significant changes in resistance depending on the content of oxygen thereof. It is advantageously easy for oxide semiconductor thin-film transistors to obtain intended physical properties. In addition, due to an oxide characteristic, transparent oxide transistors are advantageous for realizing transparent displays. However, to use an oxide active layer in thin-film transistors, a separate conductorization process of forming connections to source and drain electrodes may be required.

SUMMARY

In a transistor fabrication process of the related art, a method may be deposited on an active layer, and an etching process may be performed. Here, there is a problem in that the active layer may be damaged. In addition, in the transistor fabrication process of the related art, there is also a problem in that the active layer may be damaged by a metal deposited on the active layer. In this regard, the inventors of the present disclosure have invented a display device having a transistor structure capable of preventing damage to the active layer.

Accordingly, embodiments of the present disclosure are directed to a display device that substantially obviates one or more of the problems due to limitations and disadvantages of the related art.

An aspect of the present disclosure is to provide a display device having a transistor structure capable of preventing damage to the active layer in a panel fabrication process.

Another aspect of the present disclosure is to provide a display device having a capacitor structure corresponding to a transistor structure capable of preventing damage to the active layer in the panel fabrication process.

Another aspect of the present disclosure is to provide a display device having a transistor structure capable of preventing damage (or contamination) to the active layer by a metal even when the metal is deposited on the active layer.

Another aspect of the present disclosure is to provide a display device including a transistor having high performance, high stability, and high reliability.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises: a substrate; a main active layer positioned on the substrate, and including a channel area, a first conductorized area positioned on a first side of the channel area, and a second conductorized area positioned on a second side of the channel area opposite to the first side; at least one sacrificial active layer positioned on the main active layer; a gate insulating film positioned on the channel area of the main active layer; a first electrode positioned on the at least one sacrificial active layer, a portion of the first electrode overlapping the first conductorized area of the main active layer; a second electrode positioned on the at least one sacrificial active layer, a portion of the second electrode overlapping the second conductorized area of the main active layer; and a third electrode positioned on the gate insulating film and overlapping the channel area of the main active layer.

The thickness of each of the at least one sacrificial active layer may be lower than the thickness of the main active layer.

The at least one sacrificial active layer may comprise one sacrificial active layer, and the gate insulating film may be positioned on the one sacrificial active layer.

The thickness of the one sacrificial active layer may be not uniform, and each of the thickness of a portion of the one sacrificial active layer overlapping the first electrode and the thickness of a portion of the one sacrificial active layer overlapping the second electrode may be higher than the thickness of a portion of the one sacrificial active layer overlapping the third electrode.

The thickness of a thickest portion of the one sacrificial active layer may be lower than the thickness of the main active layer.

The one sacrificial active layer may comprise: a first part overlapping the first electrode; a second part overlapping the second electrode; a third part overlapping the third electrode; and a fourth part not overlapping any of the first electrode, the second electrode, and the third electrode, wherein the fourth part may comprise a conductorized portion, and a portion of the third part may comprise a non-conductorized portion.

The main active layer may contain a first semiconductor material, and the sacrificial active layer may contain a second semiconductor material different from the first semiconductor material.

The at least one sacrificial active layer may comprise a first sacrificial active layer positioned on the first conductorized area of the main active layer, and a second sacrificial active layer positioned on the second conductorized area of the main active layer, wherein the first electrode may be positioned on the first sacrificial active layer and the second electrode may be positioned on the second sacrificial active layer.

Each of the first sacrificial active layer and the second sacrificial active layer may be conductorized.

Each of the first sacrificial active layer and the second sacrificial active layer may comprise a first semiconductor material, and the main active layer may comprise a second semiconductor material different from the first semiconductor material.

The first semiconductor material may have a first etching rate, and the second semiconductor material may have a second etching rate lower than the first etching rate.

The first semiconductor material may be relatively more damaged by a metal than the second semiconductor material.

The first semiconductor material may be relatively less damaged by a wet etching than the second semiconductor material.

The first semiconductor material may be based on In, and the second semiconductor material may be based on Sn.

The display device may further comprise: a first auxiliary electrode between the at least one sacrificial active layer and the first electrode; and a second auxiliary electrode between the at least one sacrificial active layer and the second electrode.

Each of the first auxiliary electrode and the second auxiliary electrode may comprise a metal.

Each of the first auxiliary electrode and the second auxiliary electrode may comprise a transparent conductive oxide.

The display device may further comprise a transistor disposed in a display area or a non-display area of the display device, wherein the transistor comprises the main active layer, the at least one sacrificial active layer, the first electrode, the second electrode, and the third electrode.

The display device may further comprise: a light shield positioned on the substrate and overlapping the channel area of the main active layer; a buffer layer positioned on the light shield and below the main active layer; a capacitor disposed in a display area or a non-display area of the display device; wherein the capacitor may comprise a first plate, a second plate, and a third plate, and the buffer layer may be positioned between the first plate and the second plate, and the gate insulating film may be positioned between the second plate and the third plate.

The first plate may be the light shield or comprise a metal contained in the light shield, the third plate may comprise an electrode plate that is the third electrode, is electrically connected to the third electrode, or contains the same metal as the third electrode, and the second plate may comprise a main plate comprising a conductorized material of a semiconductor material the same as a semiconductor material contained in the main active layer and a sacrificial plate comprising a conductorized material of a semiconductor material the same as a semiconductor material contained in the at least one sacrificial active layer.

The third plate may comprise an additional plate between the electrode plate and the gate insulating film; or the second plate may comprise an additional plate between the sacrificial plate and the gate insulating film.

The additional plate may contain a metal material the same as a metal material contained in each of a first auxiliary electrode between the at least one sacrificial active layer and the first electrode and a second auxiliary electrode between the at least one sacrificial active layer and the second electrode.

The main active layer may contain the first semiconductor material based on In. The sacrificial active layer may contain the second semiconductor material based on Sn.

The etching rate of the first semiconductor material may be higher than the etching rate of the second semiconductor material.

In another aspect, a display device comprises: a substrate; a main active layer positioned on the substrate, and including a channel area, a first conductorized area positioned on a first side of the channel area, and a second conductorized area positioned on a second side of the channel area; a first sacrificial active layer positioned on the first conductorized area of the main active layer; a second sacrificial active layer positioned on the second conductorized area of the main active layer; a gate insulating film positioned on the channel area of the main active layer; a first electrode positioned on the first sacrificial active layer, a portion of the first electrode overlapping the first conductorized area of the main active layer; a second electrode positioned on the second sacrificial active layer, a portion of the second electrode overlapping the second conductorized area of the main active layer; and a third electrode positioned on the gate insulating film and overlapping the channel area of the main active layer.

The thickness of each of the first sacrificial active layer and the second sacrificial active layer may be lower than the thickness of the main active layer Each of the first sacrificial active layer and the second sacrificial active layer may be conductorized.

Each of the first sacrificial active layer and the second sacrificial active layer may contain a first semiconductor material, and the main active layer may contain a second semiconductor material different from the first semiconductor material.

Each of the first and second sacrificial active layers may contain the first semiconductor material based on In. The main active layer may contain the second semiconductor material based on Sn.

The etching rate of the first semiconductor material may be higher than the etching rate of the second semiconductor material.

According to embodiments, the display device has the transistor structure capable of preventing damage to the active layer in a panel fabrication process.

According to embodiments, the display device has the capacitor structure corresponding to a transistor structure capable of preventing damage to the active layer in the panel fabrication process.

According to embodiments, the display device has the transistor structure capable of preventing damage (or contamination) to the active layer by a metal even when the metal is deposited on the active layer.

According to embodiments, the display device includes the transistor having high performance, high stability, and high reliability.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
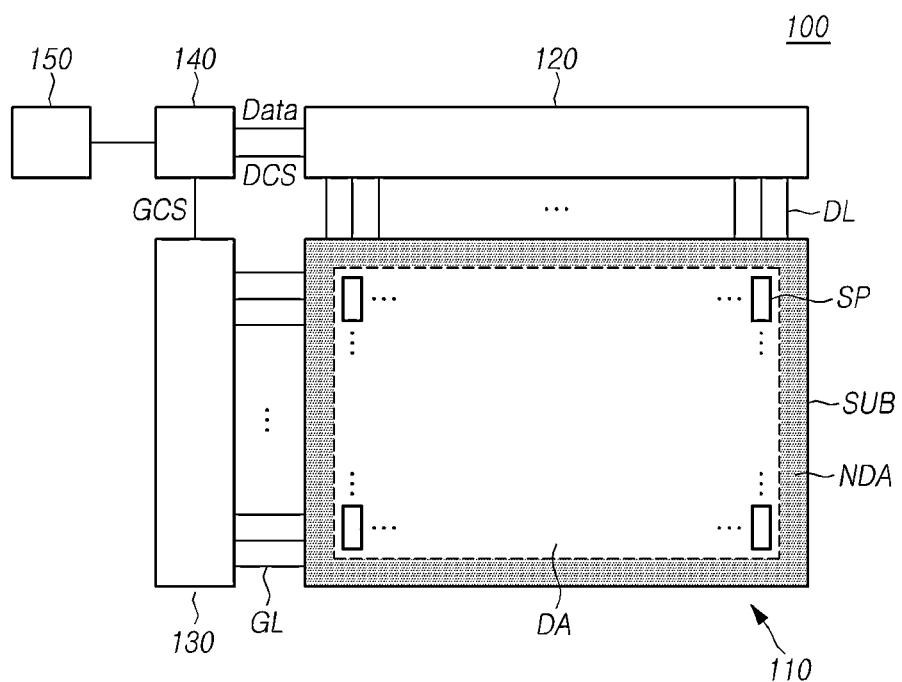
FIG. 1 is a diagram illustrating a configuration of a display device according to embodiments.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting" "made up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, a variety of embodiments will be described with reference to the accompanying drawings.

FIG. 1 is a diagram illustrating a configuration of a display device 100 according to embodiments.

Referring to FIG. 1, the display device 100 according to embodiments may include a display panel 110 and a driver circuit driving the display panel 110.

The driver circuit may include a data driver circuit 120, a gate driver circuit 130, and the like. The driver circuit may further include a controller 140 controlling the data driver circuit 120 and the gate driver circuit 130.

The display panel 110 may include a substrate SUB and signal lines, such as a plurality of data lines DL and a plurality of gate lines GL, disposed on the substrate SUB. The display panel 110 may include a plurality of subpixels SP connected to the plurality of data lines DL and the plurality of gate lines GL.

The display panel 110 may include a display area DA on which images are displayed and a non-display area NDA on which images are not displayed. In the display panel 110, the plurality of subpixels SP for displaying images are disposed in the display area DA. In the non-display area NDA, a pad part to which the driver circuits (i.e., the data driver circuit 120, the gate driver circuit 130, and the controller 140) are electrically connected, on which on the driver circuits 120, 130, and 140 are mounted, or to which integrated circuits or a printing circuit are connected may be disposed.

The data driver circuit 120 is a circuit driving the plurality of data lines DL, and may provide data signals to the plurality of data lines DL. The controller 140 may provide control signals DCS to the data driver circuit 120 to control the operation timing of the data driver circuit 120. The controller 140 may provide gate control signals GCS to the gate driver circuit 130 to control the operation timing of the gate driver circuit 130.

The controller 140 may start scanning at points in time defined for respective frames, convert image data input from an external source 150 into image data Data having a data signal format readable by the data driver circuit 120, provide the image data Data to the data driver circuit 120, and control data driving at appropriate points in time in response to the scanning.

The controller 140 may output a variety of gate control signals GCS including a gate start pulse (GSP) signal, a gate shift clock (GSC) signal, a gate output enable (GOE) signal, and the like in order to control the gate driver circuit 130.

The controller 140 may output a variety of data control signals DCS including a source start pulse (SSP) signal, a source sampling clock (SSC) signal, a source output enable (SOE) signal, and the like in order to control the data driver circuit 120.

The controller 140 may be provided as a component separate from the data driver circuit 120 or may be combined with the data driver circuit 120 to form an integrated circuit (IC).

The data driver circuit 120 drives the plurality of data lines DL by receiving the image data Data from the controller 140 and supplying a data voltage to the plurality of data lines DL. Herein, the data driver circuit 120 is also referred to as a source driver circuit.

The data driver circuit 120 may include one or more source driver integrated circuit (SDIC).

For example, each of the SDICs may be connected to the display panel 110 by a tape-automated bonding (TAB) method, connected to a bonding pad of the display panel 110 by a chip-on-glass (COG) method or a chip on panel (COP) method, or implemented using a chip-on-film (COF) structure connected to the display panel 110.

The gate driver circuit 130 may output gate signals having a turn-on level or a turn-off level, under the control of the controller 140. The gate driver circuit 130 may sequentially drive the plurality of gate lines GL by sequentially providing gate signals having a turn-on level or a turn-off level to the plurality of gate lines GL.

The gate driver circuit 130 may be connected to the display panel 110 by a TAB method, connected to a bonding pad of the display panel 110 by a COG method or a COP method, or connected to the display panel 110 by a COF method. Alternatively, the gate driver circuit 130 may be formed in the non-display area NDA of the display panel 110 by a gate-in-panel (GIP) method. The gate driver circuit 130 may be disposed on the substrate SUB or connected to the substrate SUB. That is, when the gate driver circuit 130 is a GIP type, the gate driver circuit 130 may be disposed on the substrate SUB in the non-display area NDA of the display panel 110. When the gate driver circuit 130 is a COG type, a COF type, or the like, the gate driver circuit 130 may be connected to the substrate SUB.

In addition, at least one driver circuit of the data driver circuit 120 and the gate driver circuit 130 may be disposed in the display area DA. For example, at least one driver circuit of the data driver circuit 120 and the gate driver circuit 130 may be disposed to not overlap the subpixels SP or to overlap a portion or the entirety of the subpixels SP.

When a specific gate line GL among the plurality of gate lines GL is opened by the gate driver circuit 130, the data driver circuit 120 may convert the image data Data received from the controller 140 into an analog voltage and supply the analog voltage to the plurality of data lines DL.

The data driver circuit 120 may be connected to one side (e.g., a top side or a bottom side) of the display panel 110. The data driver circuit 120 may be connected to both sides (e.g., both the top side and the bottom side) of the display panel 110 or connected to two or more sides among four sides of the display panel 110, depending on the driving method, the design of the display panel, or the like.

The gate driver circuit 130 may be connected to one side (e.g., a left side or a right side) of the display panel 110. The gate driver circuit 130 may be connected to both sides (e.g., both the left side and the right side) of the display panel 110 or connected to two or more sides among four sides of the display panel 110, depending on the driving method, the design of the display panel, or the like.

The controller 140 may be a timing controller used in typical display field, may be a control device including a timing controller and able to perform other control functions, may be a control device different from the timing controller, or may be a circuit in a control device. The controller 140 may be implemented as a variety of circuits or electronic components, such as an integrated circuit (IC), a field programmable gate array (FPGA), an application specific integrated circuit (ASIC), a processor, or the like.

The controller 140 may be mounted on a printed circuit board (PCB), a flexible printed circuit (FPC), or the like, and electrically connected to the data driver circuit 120 and the gate driver circuit 13 through the PCB, the FPC, or the like.

The display device 100 according to the present embodiments may be a display, such as a liquid crystal display device, including a backlight unit or may be a self-emissive display, such as an organic light-emitting diode (OLED) display, a quantum dot display, or a micro light-emitting diode (LED) display.

When the display device 100 according to the present embodiments is an OLED display, each of the subpixels SP may include a self-emissive OLED as an emitting device. When the display device 100 is a quantum dot display, each of the subpixels SP may include an emitting device implemented as a quantum dot that is a self-emissive semiconductor crystal. When the display device 100 according to the present embodiments is a micro LED display, each of the subpixels SP may include, as an emitting device, a self-emissive micro LED formed on the basis of an inorganic material.

Figure 2:
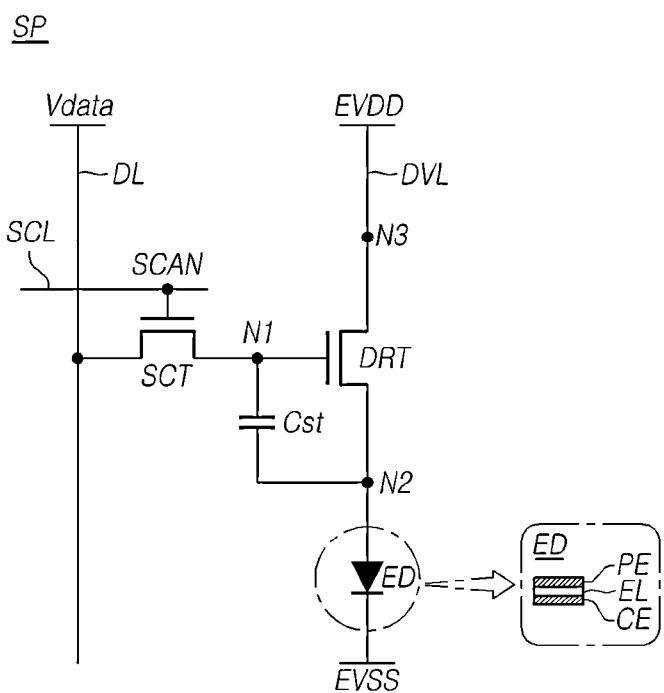
FIG. 2 illustrates an equivalent circuit of a subpixel of the display device according to embodiments.
Figure 3:
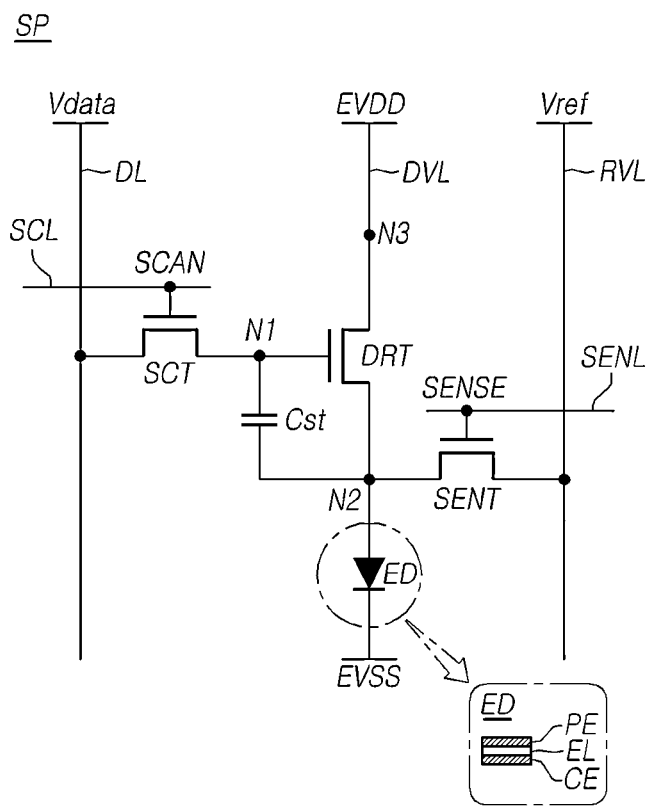
FIG. 3 illustrates another equivalent circuit of a subpixel of the display device.

FIG. 2 illustrates an equivalent circuit of a subpixel SP of the display device 100 according to embodiments, and FIG. 3 illustrates another equivalent circuit of a subpixel SP of the display device 100.

Referring to FIG. 2, each of the plurality of subpixels SP disposed in the display panel 110 of the display device 100 according to embodiments may include an emitting device ED, a driving transistor DRT, a scan transistor SCT, and a storage capacitor Cst.

Referring to FIG. 2, the emitting device ED may include a pixel electrode PE, a common electrode CE, and an emissive layer EL positioned between the pixel electrode PE and the common electrode CE.

The pixel electrode PE of the emitting device ED may be an electrode disposed on each of the subpixels SP, and the common electrode CE may be an electrode commonly disposed on all of the subpixels SP. Here, the pixel electrode PE may be an anode, and the common electrode CE may be a cathode. In contrast, the pixel electrode PE may be a cathode, and the common electrode CE may be an anode.

For example, the emitting device ED may be an organic light-emitting diode (OLED), a inorganic light-emitting diode (LED), or a quantum dot emitting device.

The driving transistor DRT may include a first node N1, a second node N2, a third node N3, and the like as transistors for driving the emitting device ED.

The first node N1 of the driving transistor DRT may be a gate node of the driving transistor DRT, and electrically connected to a source node or a drain node of the scan transistor SCT. The second node N2 of the driving transistor DRT may be a source node or a drain node of the driving transistor DRT, and electrically connected to a source node or a drain node of a sensing transistor SENT (see FIG. 3), and electrically connected to the pixel electrode PE of the emitting device ED. The third node N3 of the driving transistor DRT may be electrically connected to a driving voltage line DVL through which a driving voltage EVDD is supplied.

The scan transistor SCT may be controlled by a scan signal SCAN that is a type of gate signal, and connected to the first node N1 of the driving transistor DRT and a data line DL. That is, the scan transistor SCT may be turned on or off by the scan signal SCAN supplied through a scan signal line SCL that is a type of gate line GL, and control the connection between the data line DL and the first node N1 of the driving transistor DRT.

The scan transistor SCT may be turned on by the scan signal SCAN having a turn-on level voltage to transfer a data voltage Vdata supplied through the data line DL to the first node N1 of the driving transistor DRT.

Here, when the scan transistor SCT is an N-type transistor, the turn-on level voltage of the scan signal SCAN may be a high level voltage. When the scan transistor SCT is a P-type transistor, the turn-on level voltage of the scan signal SCAN may be a low level voltage.

The storage capacitor Cst may be connected to the first node N1 and the second node N2 of the driving transistor DRT. The storage capacitor Cst is charged with an amount of electric charge corresponding to the voltage difference between both ends of the storage capacitor Cst, and serves to maintain the voltage difference between the both ends for a predetermined frame time. Thus, for the predetermined frame time, the corresponding subpixel SP may emit light.

Referring to FIG. 3, each of the plurality of subpixels SP disposed in the display panel 110 of the display device 100 according to the present embodiments may further include the sensing transistor SENT.

The sensing transistor SENT may be controlled by a sense signal SENSE that is a type of gate signal, and connected to the second node N2 of the driving transistor DRT and a reference voltage line RVL. In other words, the sensing transistor SENT may be turned on or off by the sense signal SENSE supplied through a sense signal line SENL that is a type of gate line GL to control the connection between the reference voltage line RVL and the second node N2 of the driving transistor DRT.

The sensing transistor SENT may be turned on by the sense signal SENSE having the turn-on level voltage to transfer a reference voltage Vref supplied through the reference voltage line RVL to the second node N2 of the driving transistor DRT.

In addition, the sensing transistor SENT may be turned on by the sense signal SENSE having a turn-on level voltage to transfer a voltage of the second node N2 of the driving transistor DRT to the reference voltage line RVL.

Here, when the sensing transistor SENT is an N-type transistor, the turn-on level voltage of the sense signal SENSE may be a high level voltage. When the sensing transistor SENT is a P-type transistor, the turn-on level voltage of the sense signal SENSE may be a low level voltage.

The function of the sensing transistor SENT to transfer the voltage of the second node N2 of the driving transistor DRT to the reference voltage line RVL may be used in driving for sensing the characteristics of the subpixel SP. In this case, the voltage transferred to the reference voltage line RVL may be a voltage used to calculate the characteristics of the subpixel SP or a voltage on which the characteristics of the subpixel SP are reflected.

Each of the driving transistor DRT, the scan transistor SCT, and the sensing transistor SENT may be an N-type transistor or a P-type transistor. In the present disclosure, for the sake of brevity, each of the driving transistor DRT, the scan transistor SCT, and the sensing transistor SENT will be illustrated as being an N-type transistor.

The storage capacitor Cst may be an external capacitor intentionally designed to be provided externally of the driving transistor DRT, rather than a parasitic capacitor, i.e., an internal capacitor present between the gate node and the source node (or the drain node) of the driving transistor DRT (i.e., Cgs or Cgd).

The scan signal line SCL and the sense signal line SENL may be different gate lines GL. In this case, the scan signal SCAN and the sense signal SENSE may be different gate signals, the on-off timing of the scan transistor SCT in a single subpixel SP may be independent of the on-off timing of the sensing transistor SENT in the same subpixel SP. That is, the on-off timing of the scan transistor SCT and the on-off timing of the sensing transistor SENT in a single subpixel SP may be the same or different from each other.

Alternatively, the scan signal line SCL and the sense signal line SENL may be the same gate line GL. The gate node of the scan transistor SCT and the gate node of the sensing transistor SENT in a single subpixel SP may be connected to a single gate line GL. In this case, the scan signal SCAN and the sense signal SENSE may be the same gate signal, and the on-off timing of the scan transistor SCT and the on-off timing of the sensing transistor SENT in a single subpixel SP may be the same.

The structures of the subpixels SP illustrated in FIGS. 2 and 3 are for illustrative purposes only, and may be variously modified in forms by further including one or more transistors or one or more capacitors.

In addition, in FIGS. 2 and 3, the subpixel structures have been described by assuming that the display device 100 is a self-emissive display device. Alternatively, when the display device 100 is a liquid crystal display (LCD), each of the subpixels SP may include a transistor, a pixel electrode, and the like.

Figure 4:
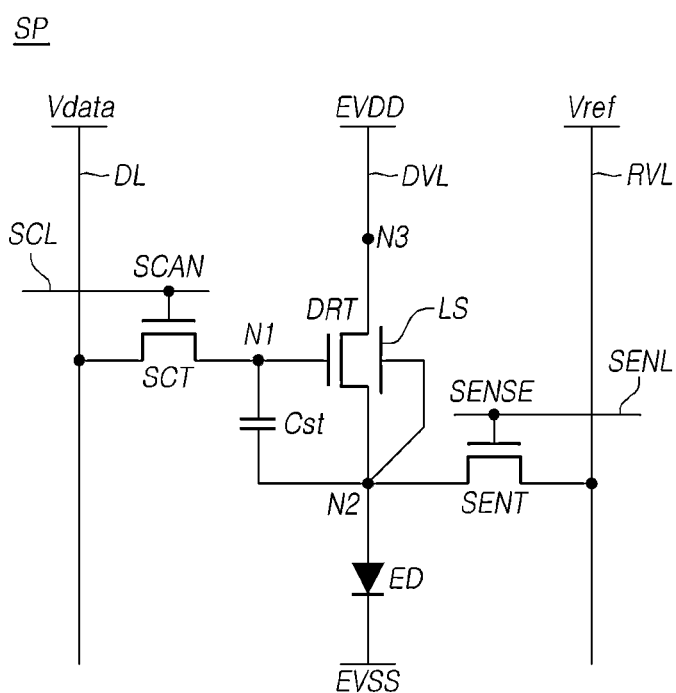
FIG. 4 is a diagram illustrating a light shield in a subpixel of the display device according to embodiments.

FIG. 4 is a diagram illustrating a light shield LS in a subpixel SP of the display device 100 according to embodiments.

Referring to FIG. 4, in the subpixel SP of the display device 100 according to embodiments, the driving transistor DRT may have unique characteristics, such as a threshold voltage and mobility. When the unique characteristics of the driving transistor DRT change, the current driving performance (i.e., current supply performance) of the driving transistor DRT may also change, thereby changing the emission characteristics of the corresponding subpixel SP.

Device characteristics (e.g., threshold voltage and mobility) of the driving transistor DRT may change over the driving time of the driving transistor DRT. In addition, when the driving transistor DRT is illuminated with light, in particular, the channel area of the driving transistor DRT is illuminated with light, the device characteristics (e.g., threshold voltage and mobility) of the driving transistor DRT may change.

Thus, as illustrated in FIG. 4, in order to reduce changes in the device characteristics (e.g., changes in the threshold voltage or the mobility) of the driving transistor DRT, the light shield LS may be provided adjacent to the driving transistor DRT. For example, the light shield LS may be provided below the channel area of the driving transistor DRT.

The light shield LS may be provided below the channel area of the driving transistor DRT to serve as a body of the driving transistor DRT.

A body effect may occur in the driving transistor DRT. To reduce the influence of the body effect, the light shield LS serving as the body of the driving transistor DRT may be electrically connected to the second node N2 of the driving transistor DRT. Here, the second node N2 of the driving transistor DRT may be the source node of the driving transistor DRT.

Meanwhile, the light shield LS may be disposed below not only the channel area of the driving transistor DRT but also the channel area of another transistor (e.g., the scan transistor SCT or the sensing transistor SENT).

In addition, in the transistor forming process, the channel area of an active layer may be damaged by etching (in particular, wet etching). When a metal is formed on the active layer, the channel area of the active layer may be damaged. Herein, the active layer may be referred to as a semiconductor layer or a channel layer. Herein, the damage may also be interpreted as contamination.

Embodiments disclose a transistor structure capable of reducing risks in which the active layer serving as a channel may be damaged in the etching process or the metal forming process. Consequently, the transistors of the display device 100 according to embodiments may have high performance, high stability, and high reliability.

Here, the transistors having the transistor structure according to embodiments may be all or some of the transistors disposed in the display panel 110. In an example, the transistors having the transistor structure according to embodiments may include all or some of the transistors in each of the subpixels SP. In another example, the transistors having the transistor structure according to embodiments may include all or some of the transistors in the GIP-type gate driver circuit 130.

The transistor structure according to embodiments may be a structure including not only a main active layer but also a sacrificial active layer serving to prevent damage to the main active layer. Herein, the transistor will also be referred to as a thin-film transistor (TFT).

Figure 5:
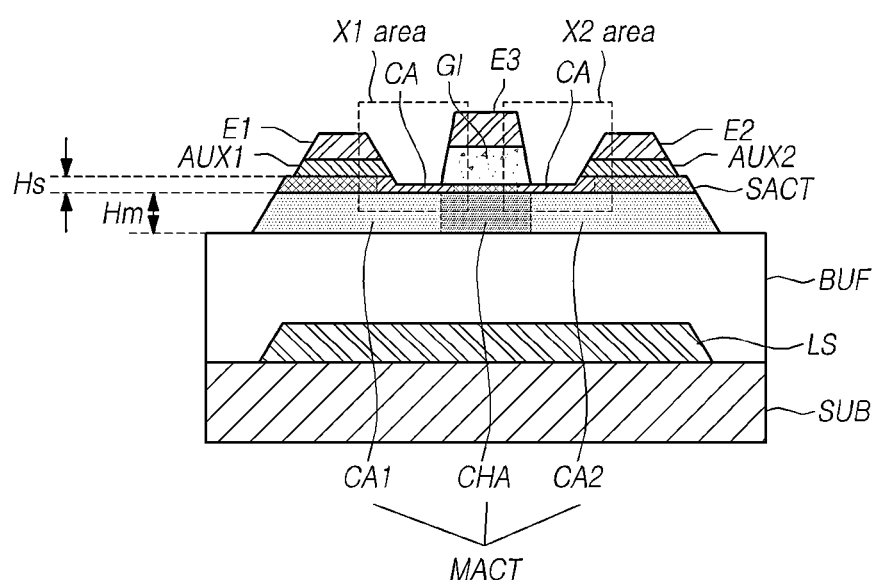
FIG. 5 is a cross-sectional diagram illustrating a transistor structure of the display device according to embodiments.
Figure 6A:
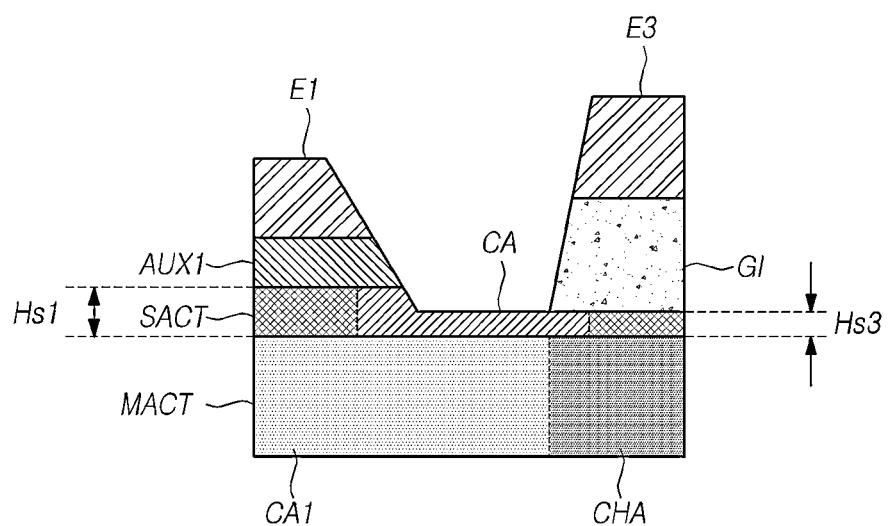
FIG. 6A is a cross-sectional diagram of X1 area in FIG. 5.
Figure 6B:
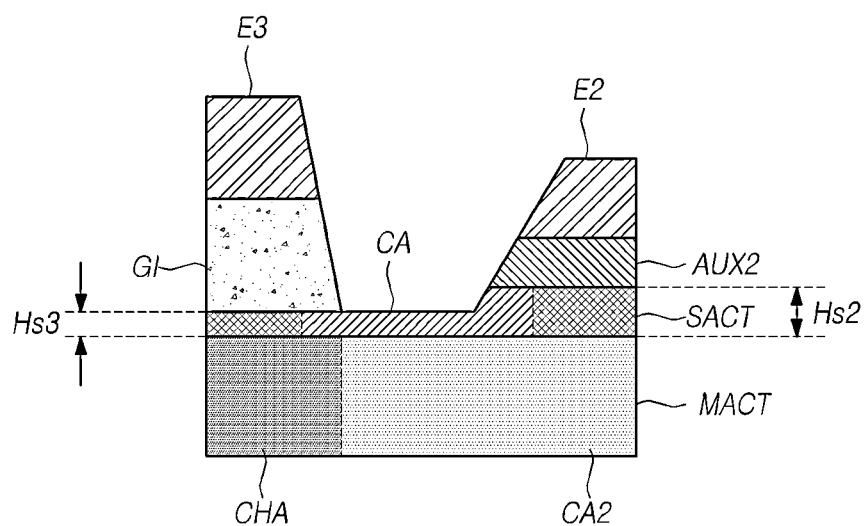
FIG. 6B is a cross-sectional diagram of X2 area in FIG. 5.
Figure 7:
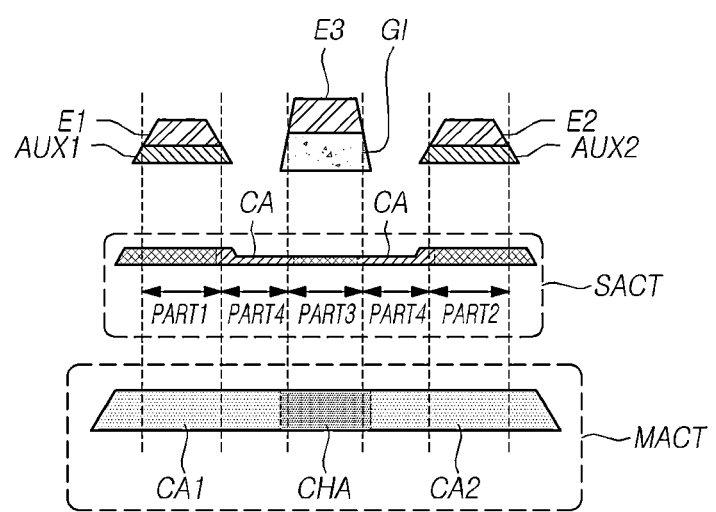
FIG. 7 is a cross-sectional view illustrating a structure of the main active layer and the sacrificial active layer in FIG. 5.

FIG. 5 is a cross-sectional diagram illustrating a transistor structure of the display device 100 according to embodiments, FIG. 6A is a cross-sectional diagram of X1 area in FIG. 5, FIG. 6B is a cross-sectional diagram of X2 area in FIG. 5, and FIG. 7 is a cross-sectional view illustrating a structure of a main active layer MACT and a sacrificial active layer SACT in FIG. 5. In FIG. 7, to describe the structure of each of the main active layer MACT and the sacrificial active layer SACT, electrodes E1, E2, and E3, the main active layer MACT, and the sacrificial active layer SACT are illustrated in an exploded view.

Referring to FIGS. 5, 6A, 6B, and 7, the display device 100 according to embodiments may include the main active layer MACT, the sacrificial active layer SACT, a gate insulating film GI, a first electrode E1, a second electrode E2, a third electrode E3, and the like.

Referring to FIGS. 5, 6A, 6B, and 7, the main active layer MACT may be positioned on a substrate SUB, and include a channel area CHA, a first conductorized area CA1 positioned on a first side of the channel area CHA, and a second conductorized area CA2 positioned on a second side of the channel area CHA opposite to the first side.

Referring to FIGS. 5, 6A, 6B, and 7, the sacrificial active layer SACT may be positioned on the main active layer MACT.

Referring to FIGS. 5, 6A, 6B, and 7, the gate insulating film GI may be positioned on the sacrificial active layer SACT and on the channel area CHA of the main active layer MACT.

Referring to FIGS. 5, 6A, 6B, and 7, the first electrode E1 may be positioned on the sacrificial active layer SACT. A portion of the first electrode E1 may overlap the first conductorized area CA1 of the main active layer MACT.

The second electrode E2 may be positioned on the sacrificial active layer SACT. A portion of the second electrode E2 may overlap the second conductorized area CA2 of the main active layer MACT.

The third electrode E3 may be positioned on the gate insulating film GI. A portion of the third electrode E3 may overlap the channel area CHA of the main active layer MACT.

The third electrode E3 may be a gate electrode, the first electrode E1 may be a source electrode or a drain electrode, the second electrode E2 may be the drain electrode or the source electrode.

Referring to FIGS. 5, 6A, 6B, and 7, in embodiments, the channel area CHA of the main active layer MACT may serve as a main channel. The sacrificial active layer SACT may serve as a sacrificial layer. Although the sacrificial active layer SACT according to embodiments serves as the sacrificial layer, the sacrificial active layer SACT is an active layer remaining in a final product. In addition, in embodiments, the sacrificial active layer SACT may serve as an interface for the channel area CHA of the main active layer MACT.

In this regard, in embodiments, each the main active layer MACT and the sacrificial active layer SACT may have unique features. Here, the unique features may include structural features regarding, for example, the thickness, material features, and the like. Hereinafter, these features will be described in more detail.

Referring to FIG. 5, the thickness Hs of the sacrificial active layer SACT may be lower than the thickness Hm of the main active layer MACT. Thus, the transfer of carriers (e.g., electrons and holes) may be properly performed. The function of the main active layer MACT as the main channel is not obstructed.

For example, the thickness Hs of the sacrificial active layer SACT may be uniform, or in some cases, may not be uniform.

Referring to FIGS. 5, 6A, 6B, and 7, when the thickness Hs of the sacrificial active layer SACT is not uniform, each of the first thickness Hs1 of a portion of the sacrificial active layer SACT overlapping the first electrode E1 and the second thickness Hs2 of a portion of the sacrificial active layer SACT overlapping the second electrode E2 may be higher than the thickness Hs3 of a portion of the sacrificial active layer SACT overlapping the third electrode E3.

Referring to FIGS. 5, 6A, 6B, and 7, each of the first and second thicknesses Hs1 and Hs2 of the thickest portions of the sacrificial active layer SACT may be lower than the thickness Hm of the main active layer MACT.

Referring to FIGS. 5, 6A, 6B, and 7, the sacrificial active layer SACT may include a first part PART1 overlapping the first electrode E1, a second part PART2 overlapping the second electrode E2, a third part PART3 overlapping the third electrode E3, and a fourth part PART4 not overlapping any of the first electrode E1, the second electrode E2, and the third electrode E3.

Referring to FIGS. 5, 6A, 6B, and 7, in the sacrificial active layer SACT, the fourth part PART4 may include at least a portion of a conductorized area CA, and a portion of the third part PART3 may include a non-conductorized area.

For example, in the sacrificial active layer SACT, the third part PART3 may not be conductorized, and the first part PART1, the second part PART2, and the fourth part PART4 include at least a portion of the conductorized area CA. However, in the sacrificial active layer SACT, portions of both sides of the third part PART3 adjacent to the fourth part PART4 may be in a conductorized state.

Thus, the sacrificial active layer SACT may serve as an interface for the channel area CHA of the main active layer MACT while serving as the sacrificial layer.

Referring to FIGS. 5, 6A, 6B, and 7, the display device 100 according to embodiments may further include a first auxiliary electrode AUX1 between the sacrificial active layer SACT and the first electrode E1 and a second auxiliary electrode AUX2 between the sacrificial active layer SACT and the second electrode E2.

For example, each of the first auxiliary electrode AUX1 and the second auxiliary electrode AUX2 may contain a metal.

Each of the first auxiliary electrode AUX1 and the second auxiliary electrode AUX2 may be formed by wet etching.

According to embodiments, since the sacrificial active layer SACT is positioned on the main active layer MACT, during the wet etching for forming the first auxiliary electrode AUX1 and the second auxiliary electrode AUX2, the sacrificial active layer SACT may be sacrificed by the wet etching, thereby preventing the main active layer MACT from being etched.

In addition, in the wet etching for forming the first auxiliary electrode AUX1 and the second auxiliary electrode AUX2, a metal contained in the first auxiliary electrode AUX1 and the second auxiliary electrode AUX2 may be a contaminant to the surroundings. However, according to embodiments, since the sacrificial active layer SACT is positioned on the main active layer MACT, a phenomenon in which the surface of the main active layer MACT serving as the main channel is damaged (or contaminated) by a metal (e.g., a metal contained in each of the first auxiliary electrode AUX1 and the second auxiliary electrode AUX2) produced as a byproduct during the wet etching can be prevented.

Regarding the above features, the main active layer MACT may contain a first semiconductor material having a relatively high etching rate. In contrast, the sacrificial active layer SACT may contain a second semiconductor material having a relatively low etching rate.

The main active layer MACT may contain the first semiconductor material that is relatively more damaged by the metal. In contrast, the sacrificial active layer SACT may contain the second semiconductor material that is relatively less damaged by the metal.

Thus, the sacrificial active layer SACT positioned on the main active layer MACT can prevent the surface of the main active layer MACT serving as the main channel from being damaged by the metal produced as a byproduct in the process of forming the first auxiliary electrode AUX1 and the second auxiliary electrode AUX2.

The main active layer MACT may contain the first semiconductor material that is less damaged by the wet etching. In contrast, the sacrificial active layer SACT may contain the second semiconductor material that is more damaged by the wet etching. Herein, the damage caused by the wet etching may refer to changes in the electrical characteristics of the main active layer MACT. In this case, the channel area CHA of the main active layer MACT may not serve as the channel, transfer characteristics for carriers (e.g., electrons or holes) may degrade, or on-off characteristics of the corresponding transistor may degrade.

Thus, since the sacrificial active layer SACT is positioned on the main active layer MACT, the sacrificial active layer SACT may be etched first by the wet etching, and the main active layer MACT may be prevented from being etched. Even though the main active layer MACT is etched, the main active layer MACT is less damaged by the wet etching, and thus the main active layer MACT can be prevented from being etched to the extent that the main active layer MACT does not properly serve as the main channel.

Meanwhile, to reduce the possibility that the main active layer MACT may be etched in the wet etching, the wet process is performed after the sacrificial active layer SACT having at least a predetermined thickness is formed. Thus, the thickness Hs3 of the etched portion may be lower than the thickness (Hs1 or Hs2) of the portion not etched by the wet etching process.

The portion of the sacrificial active layer SACT, not etched by the wet etching, may include a portion overlapping the first auxiliary electrode AUX1 and a portion overlapping the second auxiliary electrode AUX2.

To reduce the possibility that the main active layer MACT may be etched, even though the sacrificial active layer SACT having at least a predetermined thickness Hs is formed, the sacrificial active layer SACT should not be too thick to impede the function of the main active layer MACT as the main channel.

Meanwhile, in order to prevent the surface of the main active layer MACT serving as the main channel from being damaged by the metal produced as a byproduct in the process of forming the first auxiliary electrode AUX1 and the second auxiliary electrode AUX2, each of the first auxiliary electrode AUX1 and the second auxiliary electrode AUX2 may contain a transparent conductive oxide (TCO) rather than the metal.

As described above, the main active layer MACT may contain the first semiconductor material. The sacrificial active layer SACT may contain the second semiconductor material different from the first semiconductor material.

For example, the main active layer MACT may contain the first semiconductor material based on In. The sacrificial active layer SACT may contain the second semiconductor material based on Sn.

For example, the In-based first semiconductor material may include indium zinc oxide (IZO), indium gallium zinc oxide (IGZO), and the like. The Sn-based second semiconductor material may include indium tin zinc oxide (ITZO), indium tin gallium zinc oxide (ITGZO), tin (II) oxide (SnO), tin oxide ($Sn_2O$), tin (IV) oxide ($SnO_2$), and the like.

For example, the first semiconductor material may have an etching rate higher than the etching rate of the second semiconductor material.

For example, the first semiconductor material may be relatively more damaged by the metal, whereas the second semiconductor material may be relatively less damaged by the metal.

For example, the first semiconductor material may be relatively less damaged by the wet etching, whereas the second semiconductor material may be relatively more damaged by the wet etching.

Referring to FIGS. 5, 6A, 6B, and 7, all of the first electrode E1, the second electrode E2, and the third electrode E3 may contain the same metal material. For example, each of the first electrode E1 and the second electrode E2 may contain a metal material the same as a metal material contained in the third electrode E3. For example, each of the first electrode E1, the second electrode E2, and the third electrode E3 may contain a gate metal material. The gate metal material may mean the metal material of the third electrode E3 serving as the gate electrode or the metal material of the gate lines GL.

The structure described with reference to FIGS. 5, 6A, 6B, and 7 is a transistor structure. The display device 100 according to embodiments includes transistors disposed in the display area DA or the non-display area NDA. Each of the transistors may include the main active layer MACT, the sacrificial active layer SACT, the first electrode E1, the second electrode E2, and the third electrode E3.

The above-described transistors having the transistor structure according to embodiments may be all or some of the transistors disposed in the display panel 110. In an example, the transistors having the transistor structure according to embodiments may include all or some of the transistors in the subpixels SP. In another example, the transistors having the transistor structure according to embodiments may include all or some of the transistors in the GIP-type gate driver circuit 130.

Figure 8A:
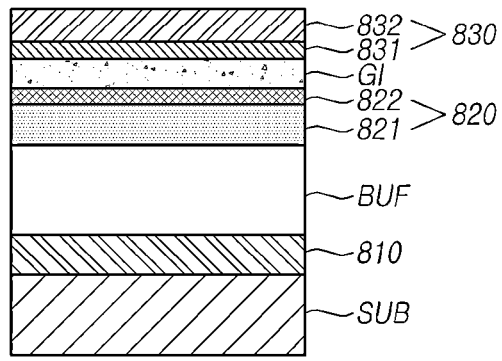
FIG. 8A is a cross-sectional diagram illustrating a capacitor structure corresponding to the transistor structure illustrated in FIG. 5.
Figure 8B:
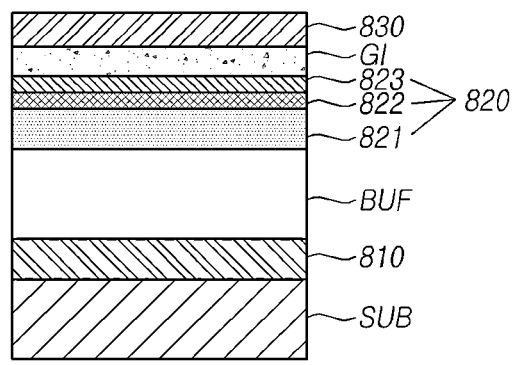
FIG. 8B is a cross-sectional diagram illustrating another capacitor structure corresponding to the transistor structure illustrated in FIG. 5.

FIG. 8A is a cross-sectional diagram illustrating a capacitor structure corresponding to the transistor structure illustrated in FIG. 5, and FIG. 8B is a cross-sectional diagram illustrating another capacitor structure corresponding to the transistor structure illustrated in FIG. 5.

Referring to FIG. 5, the display device 100 according to embodiments may further include a light shield LS positioned on the substrate SUB and overlapping the channel area CHA of the main active layer MACT and a buffer layer BUF positioned on the light shield LS and below the main active layer MACT.

Referring to FIGS. 8A and 8B, the display device 100 according to embodiments may include a capacitor having a vertical structure corresponding to the above-described transistor structure and disposed in at least one of the display area DA and the non-display area NDA.

Referring to FIGS. 8A and 8B, in the display device 100 according to embodiments, the capacitor may include a first plate 810, a second plate 820, and a third plate 830.

Referring to FIGS. 8A and 8B, the first plate 810 may be positioned on the substrate SUB. The buffer layer BUF may be positioned between the first plate 810 and the second plate 820. The gate insulating film GI may be positioned between the second plate 820 and the third plate 830.

Referring to FIGS. 8A and 8B, the first plate 810 may be the light shield LS or contain a metal contained in the light shield LS.

Referring to FIGS. 8A and 8B, the third plate 830 may comprises an electrode plate 832 including the same metal as the third electrode E3.

Referring to FIGS. 8A and 8B, the second plate 820 may include a plate 821 containing a conductorized material of a semiconductor material the same as a semiconductor material contained in the main active layer MACT and a plate 822 formed by conductorizing a semiconductor material the same as a semiconductor material contained in the sacrificial active layer SACT. Referring to FIGS. 8A and 8B, in the display device 100 according to embodiments, for example, the capacitor may include the first plate 810 containing the metal material of the light shield LS, the second plate 820 containing the semiconductor material of the active layer, and the third plate 830 containing the gate metal material. In this case, the capacitor may be referred to as having a light shield-active layer-gate metal (LAG) structure. In the fabrication of a panel, the first auxiliary electrode AUX1 and the second auxiliary electrode AUX2 may be formed before the gate insulating film GI or formed after the gate insulating film GI.

The capacitor structure illustrated in FIG. 8A indicates a situation in which the first auxiliary electrode AUX1 and the second auxiliary electrode AUX2 are formed after the gate insulating film GI in the fabrication of the panel.

Referring to FIG. 8A, the third plate 830 of the capacitor may include not only the electrode plate 832 but also an additional plate 831 between the plate 832 and the gate insulating film GI.

The additional plate 831 may contain a metal material the same as a metal material contained in each of the first auxiliary electrode AUX1 and the second auxiliary electrode AUX2.

The capacitor structure illustrated in FIG. 8B indicates a situation in which the first auxiliary electrode AUX1 and the second auxiliary electrode AUX2 are formed before the gate insulating film GI in the fabrication of the panel.

Referring to FIG. 8B, the second plate 820 of the capacitor may further include an additional plate 823 between the sacrificial plate 822 and the gate insulating film GI, the sacrificial plate 822 containing a conductorized material of a semiconductor material the same as a semiconductor material contained in the sacrificial active layer SACT.

The additional plate 823 may contain a metal material the same as a metal material contained in each of the first auxiliary electrode AUX1 and the second auxiliary electrode AUX2.

Referring to FIGS. 8A and 8B, the third plate 830 may be any one of the first to third electrodes (E1, E2 and E3) or may be electrically connected to any one of the first to third electrodes (E1, E2 and E3). The second plate 820 may be the other one of the first to third electrodes (E1, E2 and E3) or may be electrically connected to the other one of the first to third electrodes (E1, E2 and E3). The first plate 810 may be another one of the first to third electrodes (E1, E2 and E3) or may be electrically connected to another one of the first to third electrodes (E1, E2 and E3).

For example, the third plate 830 may be any one of the first electrode E1 or the second electrodes E2 or may be electrically connected to the first electrode E1 or the second electrodes. The second plate 820 may be the other one of the third electrodes E3 or may be electrically connected to the other one of the third electrodes E3. The first plate 810 may be the first electrode E1 or the second electrodes or may be electrically connected to the first electrode E1 or the second electrodes. Here, the first electrode E1 or the second electrodes may be a source node or a drain node of the transistor (e.g., the second node N2 of the driving transistor DRT). The third electrode E3 may be a gate node of the transistor (e.g., the first node N1 of the driving transistor DRT).

Hereinafter, another example of the transistor structure further including a sacrificial active layer for preventing damage to the main active layer will be described with reference to FIGS. 9, 10A, and 10B.

Figure 9:
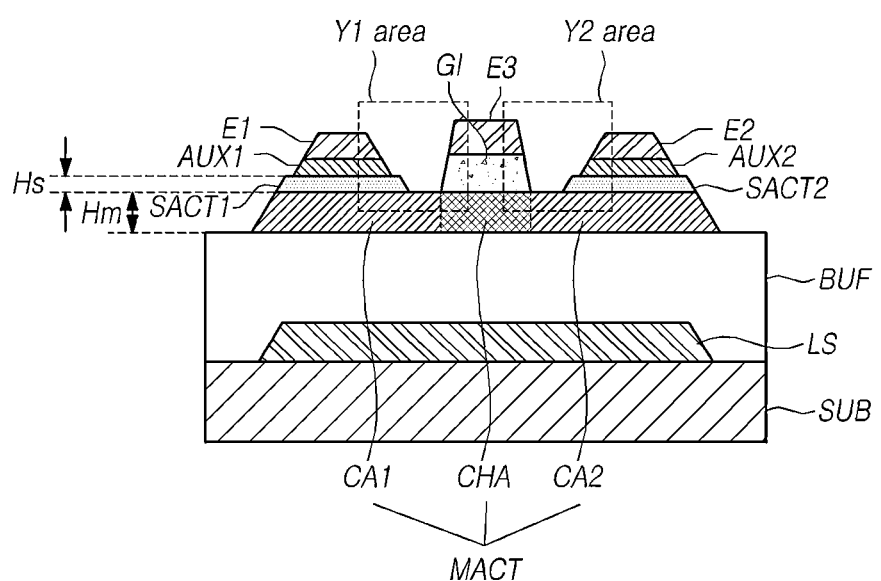
FIG. 9 is a cross-sectional diagram illustrating a transistor structure in the display device according to embodiments.
Figure 10A:
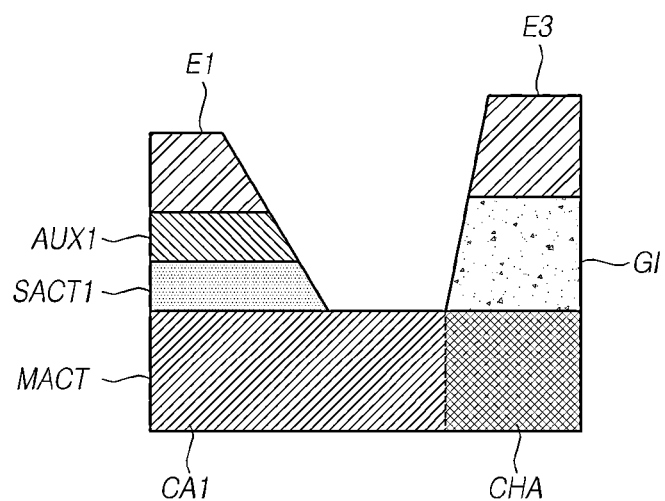
FIG. 10A is a cross-sectional diagram of Y1 area in FIG. 9.
Figure 10B:
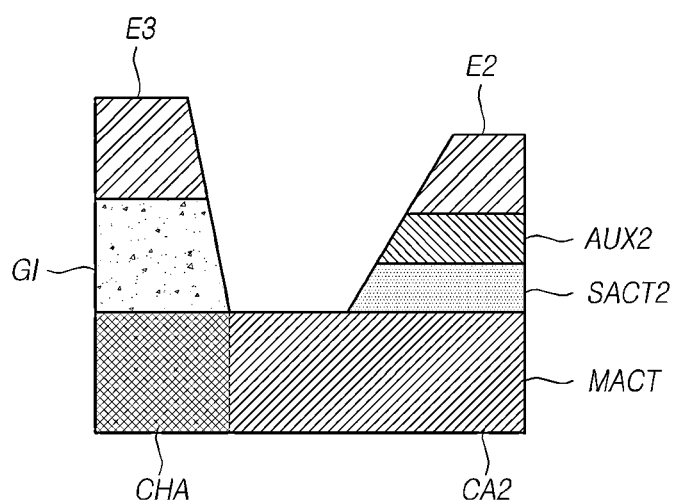
FIG. 10B is a cross-sectional diagram of Y2 area in FIG. 9.

FIG. 9 is a cross-sectional diagram illustrating a transistor structure in the display device 100 according to embodiments, FIG. 10A is a cross-sectional diagram of Y1 area in FIG. 9, and FIG. 10B is a cross-sectional diagram of Y2 area in FIG. 9.

Referring to FIGS. 9, 10A, and 10B, the display device 100 according to embodiments may include a main active layer MACT, first and second sacrificial active layers SACT1 and SACT2, a first electrode E1, a second electrode E2, a third electrode E3, and the like for the configuration of the transistor.

Referring to FIGS. 9, 10A, and 10B, the main active layer MACT may be positioned on the substrate SUB, and include a channel area CHA, a first conductorized area CA1 positioned on a first side of the channel area CHA, and a second conductorized area CA2 positioned on a second side of the channel area CHA opposite to the first side.

Referring to FIGS. 9, 10A, and 10B, the first sacrificial active layer SACT1 may be positioned on the first conductorized area CA1 of the main active layer MACT.

Referring to FIGS. 9, 10A, and 10B, the second sacrificial active layer SACT2 may be positioned on the second conductorized area CA2 of the main active layer MACT.

Referring to FIGS. 9, 10A, and 10B, the gate insulating film GI may be positioned on the channel area CHA of the main active layer MACT.

Referring to FIGS. 9, 10A, and 10B, the first electrode E1 may be positioned on a first sacrificial active layer SACT1, and a portion of the first electrode E1 may overlap the first conductorized area CA1 of the main active layer MACT.

Referring to FIGS. 9, 10A, and 10B, the second electrode E2 may be positioned on a second sacrificial active layer SACT2, and a portion of the second electrode E2 may overlap the second conductorized area CA2 of the main active layer MACT.

Referring to FIGS. 9, 10A, and 10B, the third electrode E3 may be positioned on the gate insulating film GI, and a portion of the third electrode E3 may overlap the channel area CHA of the main active layer MACT.

The third electrode E3 may be a gate electrode, the first electrode E1 may be a source electrode or a drain electrode, and the second electrode E2 may be the drain electrode or the source electrode.

Referring to FIGS. 9, 10A, and 10B, in embodiments, the channel area CHA of the main active layer MACT may serve as the main channel, and may also serve as an interface for the channel area CHA of the main active layer MACT.

In embodiments, the first and second sacrificial active layers SACT1 and SACT2 may serve as sacrificial layers to prevent damage to the main active layer MACT in the fabrication of the panel. Although the first and second sacrificial active layers SACT1 and SACT2 serve as the sacrificial layers, the first and second sacrificial active layers SACT1 and SACT2 are active layers remaining in a final product.

In embodiments, each of the main active layer MACT and the first and second sacrificial active layers SACT1 and SACT2 may have unique features. Here, the unique features may include structural features regarding, for example, the thickness, material features, and the like. Hereinafter, these features will be described in more detail.

Referring to FIGS. 9, 10A, and 10B, the thickness Hs of each of the first sacrificial active layer SACT1 and the second sacrificial active layer SACT2 may be lower than the thickness Hm of the main active layer MACT. Thus, the electrical connection between the first conductorized area CA1 of the main active layer MACT and the first electrode E1 may be improved, and the electrical connection between the second conductorized area CA2 of the main active layer MACT and the second electrode E2 may be improved.

Each of the first sacrificial active layer SACT1 and the second sacrificial active layer SACT2 may be in a conductorized state. Thus, the electrical connection between the first conductorized area CA1 of the main active layer MACT and the first electrode E1 may be further improved, and the electrical connection between the second conductorized area CA2 of the main active layer MACT and the second electrode E2 may be further improved.

Referring to FIGS. 9, 10A, and 10B, the display device 100 according to embodiments may further include a first auxiliary electrode AUX1 between the first sacrificial active layer SACT1 and the first electrode E1 and a second auxiliary electrode AUX2 between the second sacrificial active layer SACT2 and the second electrode E2.

Each of the first auxiliary electrode AUX1 and the second auxiliary electrode AUX2 may contain a metal.

Meanwhile, each of the first conductorized area CA1 and the second conductorized area CA2 of the main active layer MACT may be in an entirely conductorized state or a partially conductorized state.

In an example, each of the first conductorized area CA1 and the second conductorized area CA2 of the main active layer MACT may be actually conductorized from the top surface to the bottom surface in the depth direction. In another example, each of the first conductorized area CA1 and the second conductorized area CA2 of the main active layer MACT may be actually conductorized to an intermediate portion from the top surface, instead of being entirely conductorized in the depth direction from the top surface to the bottom surface.

According to embodiments, since the first sacrificial active layer SACT1 is positioned on the first conductorized area CA1 of the main active layer MACT, during the wet etching for forming the first auxiliary electrode AUX1, the first sacrificial active layer SACT1 may be sacrificed by the wet etching, thereby preventing the main active layer MACT from being etched.

In addition, according to embodiments, since the second sacrificial active layer SACT2 is positioned on the second conductorized area CA2 of the main active layer MACT, during the wet etching for forming the second auxiliary electrode AUX2, the second sacrificial active layer SACT2 may be sacrificed by the wet etching, thereby preventing the main active layer MACT from being etched.

In the wet etching or the metal deposition for forming the first auxiliary electrode AUX1 and the second auxiliary electrode AUX2, a metal contained in the first auxiliary electrode AUX1 and the second auxiliary electrode AUX2 may be a contaminant to the surroundings. However, according to embodiments, since the main active layer MACT contains the semiconductor material resistant to damage caused by the metal, a phenomenon in which the surface of the main active layer MACT serving as the main channel is damaged (or contaminated) by a metal (e.g., a metal contained in each of the first auxiliary electrode AUX1 and the second auxiliary electrode AUX2) produced as a byproduct during the wet etching can be prevented.

Regarding the above description, the main active layer MACT may contain the second semiconductor material having a relatively low etching rate. In contrast, each of the first and second sacrificial active layers SACT1 and SACT2 may contain the first semiconductor material having a relatively high etching rate.

The main active layer MACT may contain the second semiconductor material more resistant to damage caused by the metal. In contrast, each of the first and second sacrificial active layers SACT1 and SACT2 may contain the first semiconductor material less resistant to damage caused by the metal.

Each of the first and second sacrificial active layers SACT1 and SACT2 is conductorized to serve as an auxiliary electrode, and only the main active layer MACT resistant to damage caused by the metal serves as the channel and the interface. Thus, the surface of the main active layer MACT serving as the main channel can be prevented from being damaged by the metal produced as a byproduct in the process of forming the first auxiliary electrode AUX1 and the second auxiliary electrode AUX2.

The main active layer MACT may contain the second semiconductor material less resistant to damage caused by the wet etching. In contrast, each of the first and second sacrificial active layers SACT1 and SACT2 may contain the first semiconductor material more resistant to damage caused by the wet etching.

Thus, the first and second sacrificial active layers SACT1 and SACT2 are etched first and sacrificed in the wet etching, and thus the main active layer MACT less resistant to the wet etching can be prevented from being damaged by the wet etching.

In addition, in order to more effectively prevent the surface of the main active layer MACT serving as the main channel from being damaged by the metal produced as a byproduct in the process of forming the first auxiliary electrode AUX1 and the second auxiliary electrode AUX2, each of the first auxiliary electrode AUX1 and the second auxiliary electrode AUX2 may contain a TCO rather than the metal.

Referring to FIGS. 9, 10A, and 10B, each of the first sacrificial active layer SACT1 and the second sacrificial active layer SACT2 may contain the first semiconductor material. The main active layer MACT may contain the second semiconductor material different from the first semiconductor material.

For example, each of the first sacrificial active layer SACT1 and the second sacrificial active layer SACT2 may contain the first semiconductor material based on In. The main active layer MACT may contain the second semiconductor material based on Sn.

For example, the In-based first semiconductor material may include indium zinc oxide (IZO), indium gallium zinc oxide (IGZO), and the like. The Sn-based second semiconductor material may include indium tin zinc oxide (ITZO), indium tin gallium zinc oxide (ITGZO), tin (II) oxide (SnO), tin oxide ($Sn_2O$), tin (IV) oxide ($SnO_2$), and the like.

For example, the first semiconductor material may have an etching rate higher than the etching rate of the second semiconductor material.

For example, the first semiconductor material may be relatively more damaged by the metal, whereas the second semiconductor material may be relatively less damaged by the metal.

For example, the first semiconductor material may be relatively less damaged by the wet etching, whereas the second semiconductor material may be relatively more damaged by the metal.

Referring to FIGS. 9, 10A, and 10B, all of the first electrode E1, the second electrode E2, and the third electrode E3 may contain the same metal material. For example, each of the first electrode E1 and the second electrode E2 may contain a metal material the same as a metal material contained in the third electrode E3. For example, each of the first electrode E1, the second electrode E2, and the third electrode E3 may contain a gate metal material. The gate metal material may mean the metal material of the third electrode E3 serving as the gate electrode or the metal material of the gate lines GL.

The structure described with reference to FIGS. 9, 10A, and 10B is a transistor structure. The display device 100 according to embodiments includes transistors disposed in the display area DA or the non-display area NDA. Each of the transistors may include the main active layer MACT, the sacrificial active layers SACT1 and SACT2, the first electrode E1, the second electrode E2, and the third electrode E3.

The above-described transistors having the transistor structure according to embodiments may be all or some of the transistors disposed in the display panel 110. In an example, the transistors having the transistor structure according to embodiments may include all or some of the transistors in the subpixels SP. In another example, the transistors having the transistor structure according to embodiments may include all or some of the transistors in the GIP-type gate driver circuit 130.

Figure 11A:
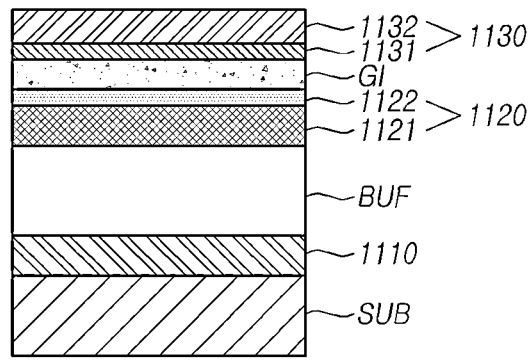
FIG. 11A is a cross-sectional diagram illustrating a capacitor structure corresponding to the transistor structure illustrated in FIG. 9.
Figure 11B:
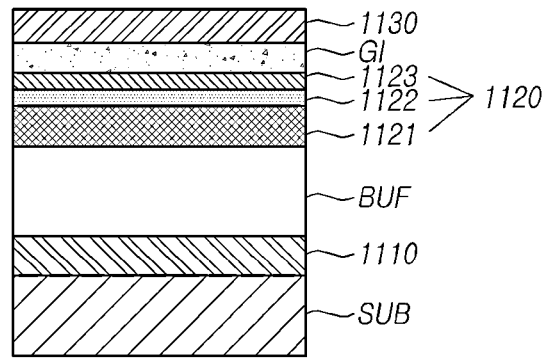
FIG. 11B is a cross-sectional diagram illustrating another capacitor structure corresponding to the transistor structure illustrated in FIG. 9.

FIG. 11A is a cross-sectional diagram illustrating a capacitor structure corresponding to the transistor structure illustrated in FIG. 9, and FIG. 11B is a cross-sectional diagram illustrating another capacitor structure corresponding to the transistor structure illustrated in FIG. 9.

Referring to FIG. 9, the display device 100 according to embodiments may further include: a light shield LS positioned on the substrate SUB and overlapping the channel area CHA of the main active layer MACT; and a buffer layer BUF positioned on the light shield LS and below the main active layer MACT.

Referring to FIGS. 11A and 11B, the display device 100 according to embodiments may include a capacitor having a vertical structure corresponding to the above-described transistor structure and disposed in at least one of the display area DA and the non-display area NDA.

Referring to FIGS. 11A and 11B, in the display device 100 according to embodiments, the capacitor may include a first plate 1110, a second plate 1120, and a third plate 1130.

Referring to FIGS. 11A and 11B, the first plate 1110 may be positioned on the substrate SUB. The buffer layer BUF may be positioned between the first plate 1110 and the second plate 1120. The gate insulating film GI may be positioned between the second plate 1120 and the third plate 1130.

Referring to FIGS. 11A and 11B, the first plate 1110 may be the light shield LS or contain a metal contained in the light shield LS.

Referring to FIGS. 11A and 11B, the third plate 1130 may comprises an electrode plate 1132 including the same metal as the third electrode E3.

Referring to FIGS. 11A and 11B, the second plate 1120 may include a main plate 1121 containing a conductorized material of a semiconductor material the same as a semiconductor material contained in the main active layer MACT and a sacrificial plate 1122 containing a conductorized material of a semiconductor material the same as a semiconductor material contained in each of the first sacrificial active layer SACT1 and the second sacrificial active layer SACT2.

In the fabrication of the panel, the first auxiliary electrode AUX1 and the second auxiliary electrode AUX2 may be formed before the gate insulating film GI or formed after the gate insulating film GI.

The capacitor structure illustrated in FIG. 11A indicates a situation in which the first auxiliary electrode AUX1 and the second auxiliary electrode AUX2 are formed after the gate insulating film GI in the fabrication of the panel Referring to FIG. 11A, the third plate 1130 of the capacitor may include not only the electrode plate 1132 but also an additional plate 1131 between the electrode plate 1132 and the gate insulating film GI.

The additional plate 1131 may contain a metal material the same as a metal material contained in each of the first auxiliary electrode AUX1 and the second auxiliary electrode AUX2.

Referring to FIG. 11B, the capacitor structure illustrated in FIG. 11B indicates a situation in which the first auxiliary electrode AUX1 and the second auxiliary electrode AUX2 are formed before the gate insulating film GI in the fabrication of the panel.

Referring to FIG. 11B, the second plate 1120 of the capacitor may further include an additional plate 1123 between the sacrificial plate 1122 and the gate insulating film GI, the sacrificial plate 1122 containing a conductorized material of a semiconductor material the same as a semiconductor material contained in the first and second sacrificial active layer SACT1 and SACT2.

The additional plate 1123 may contain a metal material the same as a metal material contained in each of the first auxiliary electrode AUX1 and the second auxiliary electrode AUX2.

Referring to FIGS. 11A and 11B, the third plate 1130 may be any one of the first to third electrodes (E1, E2 and E3) or may be electrically connected to any one of the first to third electrodes (E1, E2 and E3). The second plate 1120 may be the other one of the first to third electrodes (E1, E2 and E3) or may be electrically connected to the other one of the first to third electrodes (E1, E2 and E3). The first plate 1110 may be another one of the first to third electrodes (E1, E2 and E3) or may be electrically connected to another one of the first to third electrodes (E1, E2 and E3).

For example, the third plate 1130 may be any one of the first electrode E1 or the second electrodes E2 or may be electrically connected to the first electrode E1 or the second electrodes. The second plate 1120 may be the other one of the third electrodes E3 or may be electrically connected to the other one of the third electrodes E3. The first plate 1110 may be the first electrode E1 or the second electrodes or may be electrically connected to the first electrode E1 or the second electrodes. Here, the first electrode E1 or the second electrodes may be a source node or a drain node of the transistor (e.g., the second node N2 of the driving transistor DRT). The third electrode E3 may be a gate node of the transistor (e.g., the first node N1 of the driving transistor DRT).

The first plate (810, 1110) may be an extended portion of the light shield LS or may include a metal (light shield metal) included in the light shield LS. The first plate (810, 1110) may be electrically connected to the light shield LS or electrically connected to the first electrode E1 or the second electrode E2 that is the second node N2 of the driving transistor DRT.

The second plates (820, 1120) may include a semiconductor material of the main active layer MACT. The second plates (820, 1120) may be electrically connected to the third electrode E3 that is the first node N1 of the driving transistor DRT.

The third plates (830, 1130) may include a metal (also called gate metal) included in the first to third electrodes E1, E2, and E3. The third plates (830, 1130) may be electrically connected to the first electrode E1 or the second electrode E2 that is the second node N2 of the driving transistor DRT.

A first capacitor may be formed between the first plates 810 and 1110 and the second plates 820 and 1120. A second capacitor may be formed between the second plates 820 and 1120 and the third plates 830 and 1130. According to the above-described electrical connection structure, the first capacitor and the second capacitor may be connected in parallel to constitute the storage capacitor Cst.

The embodiments of the present disclosure set forth above will be briefly described as follows:

The display device 100 according to embodiments may include: a substrate SUB; a main active layer MACT positioned on the substrate SUB, and including a channel area CHA, a first conductorized area CA1 positioned on a first side of the channel area CHA, and a second conductorized area CA2 positioned on a second side of the channel area CHA; a sacrificial active layer SACT positioned on the main active layer MACT; a gate insulating film GI positioned on the sacrificial active layer SACT; a first electrode E1 positioned on the sacrificial active layer SACT, a portion of the first electrode E1 overlapping the first conductorized area CA1 of the main active layer MACT; a second electrode E2 positioned on the sacrificial active layer SACT, a portion of the second electrode E2 overlapping the second conductorized area CA2 of the main active layer MACT; and a third electrode E3 positioned on the gate insulating film GI and overlapping the channel area CHA of the main active layer MACT.

In the display device 100 according to embodiments, the thickness Hs of the sacrificial active layer SACT may be lower than the thickness Hm of the main active layer MACT.

In the display device 100 according to embodiments, the thickness Hs of the sacrificial active layer SACT may not uniform. Each of the thickness Hs1 of a portion of the sacrificial active layer SACT overlapping the first electrode E1 and the thickness Hs2 of a portion of the sacrificial active layer SACT overlapping the second electrode E2 may be higher than the thickness Hs3 of a portion of the sacrificial active layer SACT overlapping the third electrode E3.

In the display device 100 according to embodiments, the thickness Hs1 or Hs2 of the thickest portion of the sacrificial active layer SACT may be lower than the thickness Hm of the main active layer MACT.

In the display device 100 according to embodiments, the sacrificial active layer SACT may include: a first part PART1 overlapping the first electrode E1; a second part PART2 overlapping the second electrode E2; a third part PART3 overlapping the third electrode E3; and a fourth part PART4 not overlapping any of the first electrode E1, the second electrode E2, and the third electrode E3.

In the display device 100 according to embodiments, in the sacrificial active layer SACT, the fourth part PART4 may include at least a portion of a conductorized area CA, and a portion of the third part PART3 may include a non-conductorized area.

In the display device 100 according to embodiments, in the sacrificial active layer SACT, a portion of the first part PART1 adjacent to the fourth part PART4 may be conductorized. A portion of the second part PART2 adjacent to the fourth part PART4 may be conductorized. Both portions of the third part PART3 adjacent to the fourth part PART4 may be conductorized.

The display device 100 according to embodiments may further include: a first auxiliary electrode AUX1 between the sacrificial active layer SACT and the first electrode E1; and a second auxiliary electrode AUX2 between the sacrificial active layer SACT and the second electrode E2.

In the display device 100 according to embodiments, each of the first auxiliary electrode AUX1 and the second auxiliary electrode AUX2 may contain a metal.

In the display device 100 according to embodiments, each of the first auxiliary electrode AUX1 and the second auxiliary electrode AUX2 may contain a transparent conductive oxide (TCO).

In the display device 100 according to embodiments, the main active layer MACT may include a first oxide semiconductor ACT1. The sacrificial active layer SACT may include a second oxide semiconductor ACT2 different from the first oxide semiconductor ACT1.

In the display device 100 according to embodiments, the main active layer MACT may include the first oxide semiconductor ACT1 based on In. The sacrificial active layer SACT may include the second oxide semiconductor ACT2 based on Sn.

In the display device 100 according to embodiments, the first oxide semiconductor ACT1 may have an etching rate (i.e., a first etching rate) higher than the etching rate (i.e., a second etching rate) of the second oxide semiconductor ACT2 (first etching rate>second etching rate). That is, in the display device 100 according to embodiments, the main active layer MACT may include the first oxide semiconductor ACT1 having the first etching rate. The sacrificial active layer SACT may include the second oxide semiconductor ACT2 having the second etching rate lower than the first etching rate.

The display device 100 according to embodiments may further include a light shield LS positioned on the substrate SUB and overlapping the channel area CHA of the main active layer MACT and a buffer layer BUF positioned on the light shield LS and below the main active layer MACT.

The display device 100 according to embodiments may include a transistor and a capacitor disposed in the display area DA or the non-display area NDA.

In the display device 100 according to embodiments, the transistor may include the main active layer MACT, the sacrificial active layer SACT, the first electrode E1, the second electrode E2, and the third electrode E3.

In the display device 100 according to embodiments, the capacitor may include the first plate 810, the second plate 820, and the third plate 830. The first plate 810 may be positioned on the substrate SUB. The buffer layer BUF may be positioned between the first plate 810 and the second plate 820. The gate insulating film GI may be positioned between the second plate 820 and the third plate 830.

In the display device 100 according to embodiments, the first plate 810 may be the light shield LS or contain a metal contained in the light shield LS. The third plate 830 may be the third electrode E3, be electrically connected to the third electrode E3, or contain the same metal as the third electrode E3. The second plate 820 may include a main plate 821 containing a conductorized material of a semiconductor material the same as a semiconductor material contained in the main active layer MACT and a sacrificial plate 822 containing a conductorized material of a semiconductor material the same as a semiconductor material contained in the sacrificial active layer SACT.

The display device 100 according to embodiments may include: a substrate SUB; a main active layer MACT positioned on the substrate SUB, and including a channel area CHA, a first conductorized area CA1 positioned on a first side of the channel area CHA, and a second conductorized area CA2 positioned on a second side of the channel area CHA; a first sacrificial active layer SACT1 positioned on the first conductorized area CA1 of the main active layer MACT; a second sacrificial active layer SACT2 positioned on the second conductorized area CA2 of the main active layer MACT; a gate insulating film GI positioned on the channel area CHA of the main active layer MACT; a first electrode E1 positioned on the first sacrificial active layer SACT1, a portion of the first electrode E1 overlapping the first conductorized area CA1 of the main active layer MACT; a second electrode E2 positioned on the second sacrificial active layer SACT2, a portion of the second electrode E2 overlapping the second conductorized area CA2 of the main active layer MACT; and a third electrode E3 positioned on the gate insulating film GI and overlapping the channel area CHA of the main active layer MACT.

In the display device 100 according to embodiments, the thickness Hs of each of the first sacrificial active layer SACT1 and the second sacrificial active layer SACT2 may be lower than the thickness Hm of the main active layer MACT.

In the display device 100 according to embodiments, each of the first sacrificial active layer SACT1 and the second sacrificial active layer SACT2 may be conductorized.

The display device 100 according to embodiments may further include: a first auxiliary electrode AUX1 between the first sacrificial active layer SACT1 and the first electrode E1; and a second auxiliary electrode AUX2 between the second sacrificial active layer SACT2 and the second electrode E2.

In the display device 100 according to embodiments, each of the first auxiliary electrode AUX1 and the second auxiliary electrode AUX2 may contain a metal.

In the display device 100 according to embodiments, each of the first auxiliary electrode AUX1 and the second auxiliary electrode AUX2 may contain a transparent conductive oxide (TCO).

In the display device 100 according to embodiments, each of the first sacrificial active layer SACT1 and the second sacrificial active layer SACT2 may contain a first oxide semiconductor ACT1. The main active layer MACT may include a second oxide semiconductor ACT2 different from the first oxide semiconductor ACT1.

In the display device 100 according to embodiments, each of the first sacrificial active layer SACT1 and the second sacrificial active layer SACT2 may include the first oxide semiconductor ACT1 based on In. The main active layer MACT may include the second oxide semiconductor ACT2 based on Sn.

In the display device 100 according to embodiments, the first oxide semiconductor ACT1 may have an etching rate (i.e., a first etching rate) higher than the etching rate (i.e., a second etching rate) of the second oxide semiconductor ACT2 (first etching rate>second etching rate). That is, in the display device 100 according to embodiments, each of the first sacrificial active layer SACT1 and the second sacrificial active layer SACT2 may include the first oxide semiconductor ACT1 having the first etching rate. The main active layer MACT may include the second oxide semiconductor ACT2 having the second etching rate lower than the first etching rate.

The display device 100 according to embodiments may further include: a light shield LS positioned on the substrate SUB and overlapping the channel area CHA of the main active layer MACT; and a buffer layer BUF positioned on the light shield LS and below the main active layer MACT.

The display device 100 according to embodiments may further include a transistor and a capacitor disposed in the display area DA or the non-display area NDA.

In the display device 100 according to embodiments, the transistor may include the main active layer MACT, the first sacrificial active layer SACT1, the second sacrificial active layer SACT2, the first electrode E1, the second electrode E2, and the third electrode E3.

In the display device 100 according to embodiments, the capacitor may include a first plate 1110, a second plate 1120, and a third plate 1130. The first plate 1110 may be positioned on the substrate SUB. The buffer layer BUF may be positioned between the first plate 1110 and the second plate 1120. The gate insulating film GI may be positioned between the second plate 1120 and the third plate 1130.

In the display device 100 according to embodiments, the first plate 1110 may be the light shield LS or contain a metal contained in the light shield LS. The third plate 1130 may be the third electrode E3, be electrically connected to the third electrode E3, or contain the same metal as the third electrode E3. The second plate 1120 may include a plate 1121 containing a conductorized material of a semiconductor material the same as a semiconductor material contained in the main active layer MACT and a plate 1122 containing a conductorized material of a semiconductor material the same as a semiconductor material contained in each of the first sacrificial active layer SACT1 and the second sacrificial active layer SACT2.

According to embodiments as set forth above, the display device has the transistor structure capable of preventing damage to the active layer in the panel fabrication process.

According to embodiments, the display device has the capacitor structure corresponding to a transistor structure capable of preventing damage to the active layer in the panel fabrication process.

According to embodiments, the display device has the transistor structure capable of preventing damage (or contamination) to the active layer by a metal even when the metal is deposited on the active layer.

According to embodiments, the display device includes the transistor having high performance, high stability, and high reliability.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
    a substrate;
    a main active layer positioned on the substrate, and comprising a channel area, a first conductorized area positioned on a first side of the channel area, and a second conductorized area positioned on a second side of the channel area opposite to the first side;
    a sacrificial active layer positioned on the main active layer, a thickness of the sacrificial active layer being lower than a thickness of the main active layer;
    a gate insulating film positioned on the sacrificial active layer;
    a first electrode positioned on the sacrificial active layer, a portion of the first electrode overlapping the first conductorized area of the main active layer;
    a second electrode positioned on the sacrificial active layer, a portion of the second electrode overlapping the second conductorized area of the main active layer;
    a third electrode positioned on the gate insulating film and overlapping the channel area of the main active layer;
    a light shield positioned on the substrate and overlapping the channel area of the main active layer;
    a buffer layer positioned on the light shield and below the main active layer; and
    a transistor and a capacitor disposed in a display area or a non-display area,
    wherein the transistor comprises the main active layer, the sacrificial active layer, the first electrode, the second electrode, and the third electrode,
    the capacitor comprises a first plate, a second plate, and a third plate, and
    the buffer layer is positioned between the first plate and the second plate, and the gate insulating film is positioned between the second plate and the third plate.

2. The display device of claim 1, wherein the thickness of the sacrificial active layer is not uniform, and
    each of a thickness of a portion of the sacrificial active layer overlapping the first electrode and a thickness of a portion of the sacrificial active layer overlapping the second electrode is higher than a thickness of a portion of the sacrificial active layer overlapping the third electrode.

3. The display device of claim 2, wherein the thickness of a thickest portion of the sacrificial active layer is lower than the thickness of the main active layer.

4. The display device of claim 1, wherein the sacrificial active layer comprises:
    a first part overlapping the first electrode;
    a second part overlapping the second electrode;
    a third part overlapping the third electrode; and
    a fourth part not overlapping any of the first electrode, the second electrode, and the third electrode,
    wherein the fourth part comprises a conductorized portion, and a portion of the third part comprises a non-conductorized portion.

5. The display device of claim 1, further comprising:
    a first auxiliary electrode between the sacrificial active layer and the first electrode; and
    a second auxiliary electrode between the sacrificial active layer and the second electrode.

6. The display device of claim 5, wherein each of the first auxiliary electrode and the second auxiliary electrode comprises a metal.

7. The display device of claim 1, wherein the main active layer comprises a first semiconductor material, and the sacrificial active layer comprises a second semiconductor material different from the first semiconductor material.

8. The display device of claim 7, wherein the main active layer comprises the first semiconductor material having a first etching rate, and the sacrificial active layer comprises the second semiconductor material having a second etching rate lower than the first etching rate.

9. The display device of claim 1, wherein the first plate is the light shield or comprises a metal contained in the light shield, the third plate contains a same metal as the third electrode, and the second plate comprises a plate comprising a conductorized material of a semiconductor material the same as a semiconductor material contained in the main active layer and a plate comprising a conductorized material of a semiconductor material the same as a semiconductor material contained in the sacrificial active layer.

10. A display device, comprising:

a substrate;

a main active layer positioned on the substrate, and comprising a channel area, a first conductorized area positioned on a first side of the channel area, and a second conductorized area positioned on a second side of the channel area;

a first sacrificial active layer positioned on the first conductorized area of the main active layer, a thickness of the first sacrificial active layer being lower than a thickness of the main active layer;

a second sacrificial active layer positioned on the second conductorized area of the main active layer, a thickness of the second sacrificial active layer being lower than the thickness of the main active layer;

a gate insulating film positioned on the channel area of the main active layer;

a first electrode positioned on the first sacrificial active layer, a portion of the first electrode overlapping the first conductorized area of the main active layer;

a second electrode positioned on the second sacrificial active layer, a portion of the second electrode overlapping the second conductorized area of the main active layer;

a third electrode positioned on the gate insulating film and overlapping the channel area of the main active layer;

a light shield positioned on the substrate and overlapping the channel area of the main active layer;

a buffer layer positioned on the light shield and below the main active layer; and a transistor and a capacitor disposed in a display area or a non-display area, wherein the transistor comprises the main active layer, the first sacrificial active layer, the second sacrificial active layer, the first electrode, the second electrode, and the third electrode, the capacitor comprises a first plate, a second plate, and a third plate, and the buffer layer is positioned between the first plate and the second plate, and the gate insulating film is positioned between the second plate and the third plate.

11. The display device of claim 10, wherein each of the first sacrificial active layer and the second sacrificial active layer is conductorized.

12. The display device of claim 10, further comprising:

a first auxiliary electrode between the first sacrificial active layer and the first electrode; and a second auxiliary electrode between the second sacrificial active layer and the second electrode.

13. The display device of claim 12, wherein each of the first auxiliary electrode and the second auxiliary electrode comprises a metal.

14. The display device of claim 10, wherein each of the first sacrificial active layer and the second sacrificial active layer comprises a first semiconductor material, and the main active layer comprises a second semiconductor material different from the first semiconductor material.

15. The display device of claim 14, wherein each of the first sacrificial active layer and the second sacrificial active layer comprises the first semiconductor material having a first etching rate, and the main active layer comprises the second semiconductor material having a second etching rate lower than the first etching rate.

16. The display device of claim 10, wherein the first plate is the light shield or comprises a metal contained in the light shield, the third plate comprises a same metal as the third electrode, and the second plate comprises a plate comprising a conductorized material of a semiconductor material the same as a semiconductor material contained in the main active layer and a plate comprising a conductorized material of a semiconductor material the same as a semiconductor material contained in each of the first sacrificial active layer and the second sacrificial active layer.

* * * * *